(12) United States Patent
Mochizuki et al.

(10) Patent No.: US 12,119,264 B2
(45) Date of Patent: Oct. 15, 2024

(54) NON-STEP NANOSHEET STRUCTURE FOR STACKED FIELD-EFFECT TRANSISTORS

(71) Applicant: INTERNATIONAL BUSINESS MACHINES CORPORATION, Armonk, NY (US)

(72) Inventors: Shogo Mochizuki, Mechanicville, NY (US); Gen Tsutsui, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 17/809,595

(22) Filed: Jun. 29, 2022

(65) Prior Publication Data

US 2024/0006244 A1   Jan. 4, 2024

(51) Int. Cl.
| | |
|---|---|
| H01L 21/822 | (2006.01) |
| H01L 27/092 | (2006.01) |
| H01L 29/06 | (2006.01) |
| H01L 29/423 | (2006.01) |
| H01L 29/66 | (2006.01) |

(52) U.S. Cl.
CPC ...... *H01L 21/8221* (2013.01); *H01L 27/0922* (2013.01); *H01L 29/0673* (2013.01); *H01L 29/42392* (2013.01); *H01L 29/66787* (2013.01)

(58) Field of Classification Search
CPC ............. H01L 21/8221; H01L 27/0922; H01L 29/0673; H01L 29/42392; H01L 29/66787; H01L 29/78696
See application file for complete search history.

(56) References Cited

U.S. PATENT DOCUMENTS

| | | |
|---|---|---|
| 9,773,913 B1 | 9/2017 | Balakrishnan |
| 10,192,867 B1 | 1/2019 | Frougier |
| 10,483,361 B1 | 11/2019 | Lee |
| 10,879,308 B1 | 12/2020 | Ando |
| 10,896,851 B2 | 1/2021 | Cheng |
| 11,189,705 B2 | 11/2021 | Wong |
| 11,201,153 B2 | 12/2021 | Xie |
| 11,211,452 B1 | 12/2021 | Xie |
| 2019/0131394 A1 | 5/2019 | Reznicek |
| 2020/0006389 A1* | 1/2020 | Huang ............... H01L 29/6656 |

(Continued)

FOREIGN PATENT DOCUMENTS

| | | |
|---|---|---|
| CN | 106206732 A | 12/2016 |
| CN | 114388607 A | 4/2022 |
| CN | 114388608 A | 4/2022 |

OTHER PUBLICATIONS

International Searching Authority, "Notification of Transmittal of the International Search Report and the Written Opinion of the International Searching Authority, or the Declaration", File Reference IEE230071PCT, International application No. PCT/CN2023/090232, International Filing Date Apr. 24, 2023, Mailed on Jul. 6, 2023, 8 pages.

*Primary Examiner* — Zandra V Smith
*Assistant Examiner* — Molly K Reida
(74) *Attorney, Agent, or Firm* — Gavin Giraud

(57) ABSTRACT

Embodiments herein include semiconductor structures that may include a first field-effect transistor (FET) stacked above a second FET in a non-step nanosheet structure, and a bottom contact electrically connected to a first bottom source/drain (S/D) of the second FET through a portion of a first top S/D of the first FET.

13 Claims, 19 Drawing Sheets

(56) References Cited

U.S. PATENT DOCUMENTS

2020/0075574 A1  3/2020  Smith
2020/0127054 A1* 4/2020  Ando ................... H10N 70/021
2021/0349691 A1  11/2021 Hekmatshoartabari

* cited by examiner

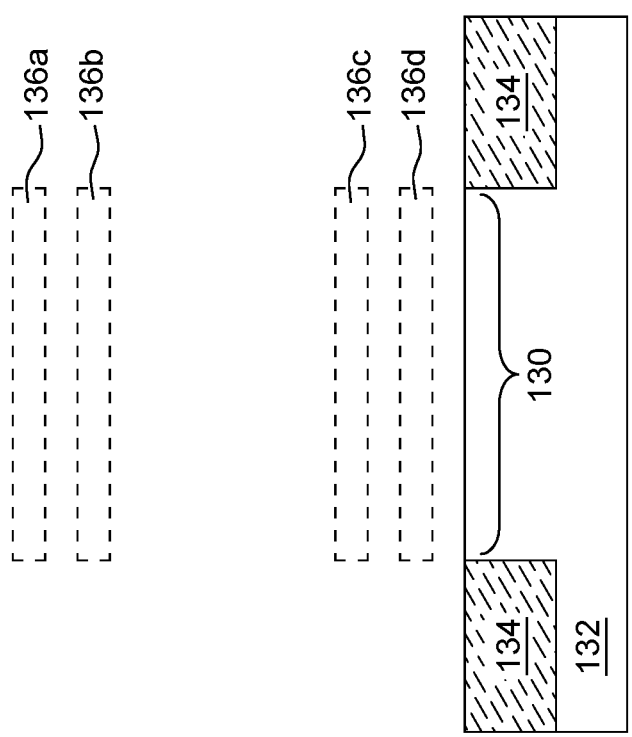

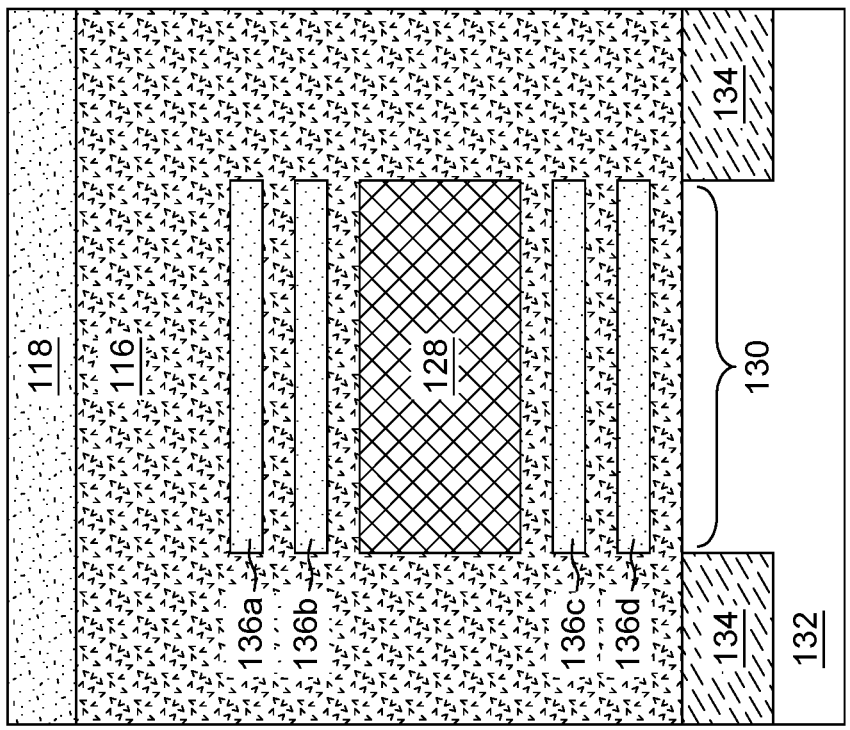
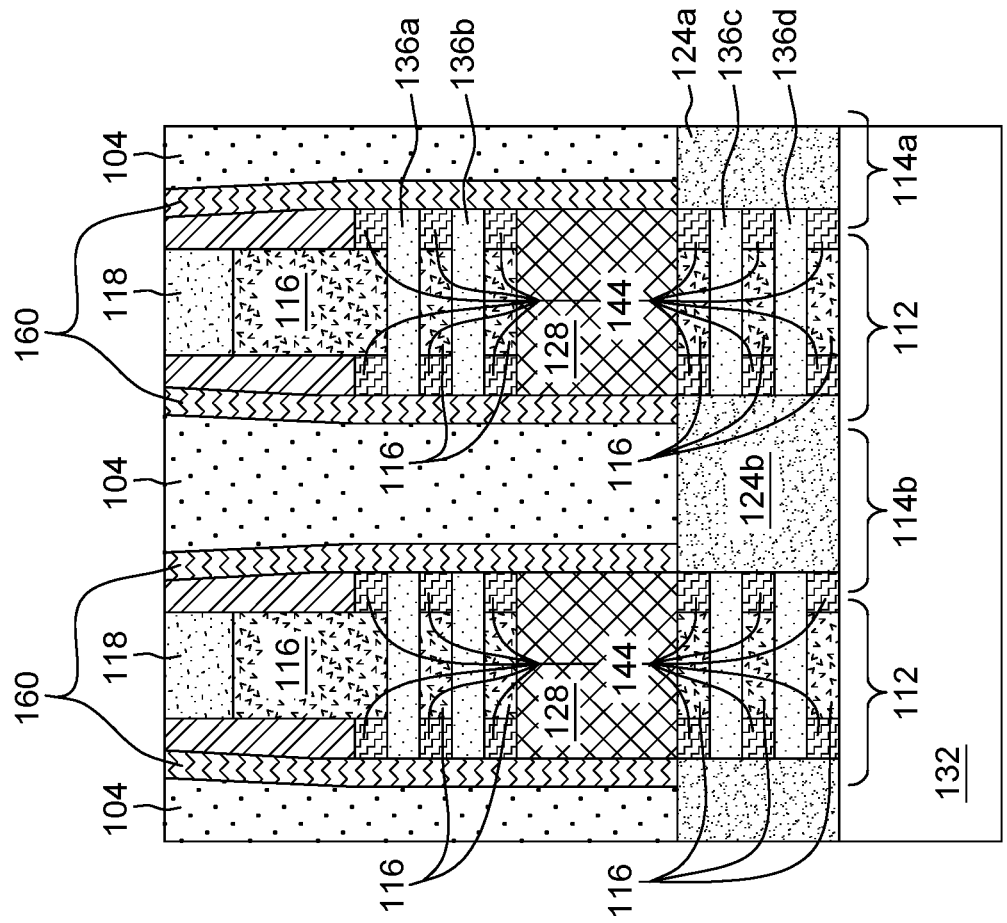
FIG. 11A
FIG. 11B

NON-STEP NANOSHEET STRUCTURE FOR STACKED FIELD-EFFECT TRANSISTORS

BACKGROUND

The present invention relates generally to the field of fabrication of semiconductor devices, and more particularly to forming a contact for a lower source/drain (S/D) in a stacked field-effect transistor.

In fabricating semiconductor devices, millions of devices can be located together on a single substrate. The continued miniaturization of metal oxide semiconductor field effect transistors (MOSFETs) has enabled useful control of these millions of devices. However, there are growing signs today that metal oxide semiconductor transistors are beginning to reach their traditional scaling limits. Since it has become increasingly difficult to improve performance of MOSFETs, and therefore complementary metal oxide semiconductor (CMOS), through continued scaling, further methods for improving performance in addition to scaling have become critical.

Stacked nanosheet designs seek to continue improvement in performance by using several thin channels with gate electrodes. Though these devices are similar to finFETs, the stacked nanosheet process flow introduces several new modules. Nanosheet transistors typically start with a Si/SiGe heterostructure, with as many layer pairs as the finished device will have channels. The nanosheets may then be fabricated from either silicon or silicon-germanium channels. The stacked nanosheet devices can also be stacked such that two or more finFETs may be fabricated vertically above one another. For such stacks, fabricating the contacts to the FETs below the top FET can be challenging.

To address the challenge of contacting the lower FETs of a device stack, some upper/top FETs may be fabricated with different dimensions than the lower FETs. For example, the upper/top FETs may be fabricated with a smaller length or a smaller width. The smaller dimensions can enable a contact to protrude from a top surface of the FET stack directly to the lower FETs, but the dimension differences between the lower FETs and upper FETs requires additional masking and etch steps that contribute to the cost and time required for fabrication.

SUMMARY

According to one embodiment of the present invention, a semiconductor structure is disclosed. The semiconductor structure may include a first field-effect transistor (FET) stacked above a second FET in a non-step nanosheet structure, and a bottom contact electrically connected to a first bottom source/drain (S/D) of the second FET through a portion of a first top S/D of the first FET. The bottom contact through the portion of the first top S/D enables the first FET and the second FET to be fabricated concurrently without additional masking or etching steps.

Certain embodiments may include a liner surrounding the bottom contact. The liner can insulate the bottom contact from the first top S/D and first FET. Specifically, the first FET may include nanosheets that are at least partially unconnected to the first top S/D, and the liner insulates the bottom contact from the nanosheets. Embodiments herein recognize that partially unconnected nanosheets do not provide a significant diminishing to the function of the first FET.

According to one embodiment of the present invention, a method is disclosed. The method may include growing a bottom source/drain (S/D) across a bottom field-effect transistor (FET), growing a top S/D across a top FET, etching a bottom contact hole through the top S/D to the bottom S/D, and metalizing the bottom contact hole to form a bottom contact. The bottom contact through the portion of the first top S/D enables the top FET and the bottom FET to be fabricated concurrently without additional masking or etching steps. The etching of the bottom contact hole through the top S/D disconnects, at least partially, the top S/D from nanosheets of the top FET, but embodiments disclosed herein recognize that such partially unconnected nanosheets do not provide a significant diminishing to the function of the first FET.

Certain embodiments may include forming a liner before metalizing the bottom contact hole. The liner can insulate the bottom contact from the first top S/D and first FET. Specifically, the first FET may include nanosheets that are at least partially unconnected to the first top S/D, and the liner insulates the bottom contact from the nanosheets. Embodiments herein recognize that partially unconnected nanosheets do not provide a significant diminishing to the function of the first FET.

According to one embodiment of the present invention, a semiconductor structure is disclosed. The semiconductor structure may include a top field-effect transistor (FET) and a bottom FET. The top FET may include a top nanosheet and a top source/drain (S/D). The top nanosheet may be wider than the top S/D. The bottom FET may include a bottom nanosheet, and a bottom S/D. The bottom nanosheet may have a same width as the top nanosheet, and the bottom S/D may be wider than the top S/D. The semiconductor structure may also include a bottom contact electrically connected to the bottom S/D through a portion of a first top S/D of the first FET. The bottom contact through the portion of the first top S/D enables the first FET and the second FET to be fabricated concurrently without additional masking or etching steps.

BRIEF DESCRIPTION OF THE DRAWINGS

FIGS. 4A, 4B, and 4C depict schematic cross-sectional side views of the semiconductor structure of FIG. 1 at a subsequent fabrication stage, in accordance with one embodiment of the present invention.

FIGS. 11A, 11B, and 11C depict schematic cross-sectional side views of the semiconductor structure of FIG. 10 at a subsequent fabrication stage, in accordance with one embodiment of the present invention.

DETAILED DESCRIPTION

Figure 2:
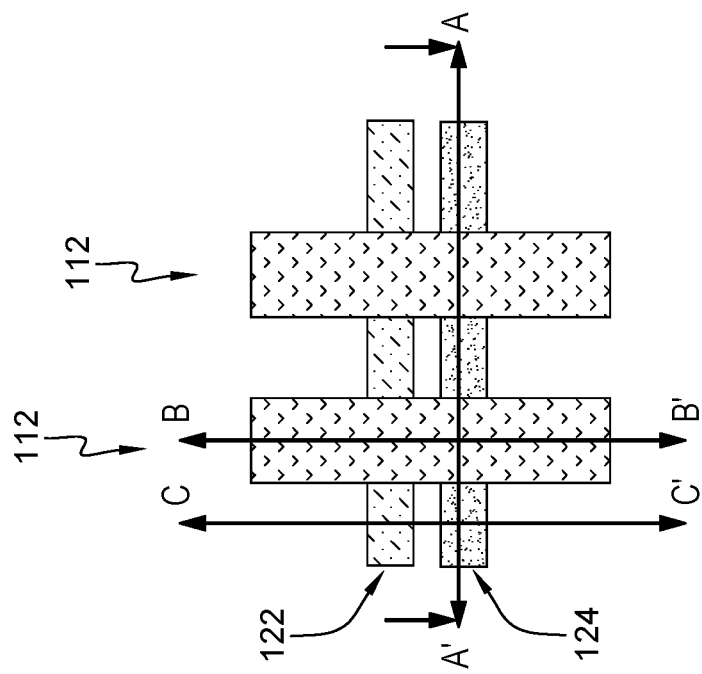
FIG. 2 depicts a schematic cross-sectional top view of the semiconductor structure of FIG. 1 at a fabrication stage, in accordance with one embodiment of the present invention.

In the following detailed description, reference is made to the accompanying drawings, which show specific examples of embodiments of the invention. These embodiments are described in sufficient detail to enable those skilled in the art to practice them, and it is to be understood that other embodiments may be utilized, and that structural, logical and electrical changes may be made without departing from the described embodiments. The following detailed description is, therefore, not to be taken in a limiting sense, and the included embodiments are defined by the appended claims.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "right," "left," "vertical," "horizontal," "top," "bottom," "lower," "upper" and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

With regard to the fabrication of transistors and integrated circuits, major surface refers to that surface of the semiconductor layer in and about which a plurality of transistors are fabricated, e.g., in a planar process. As used herein, the term "vertical" means substantially orthogonal with respect to the major surface and "horizontal" means substantially parallel to the major surface. Typically, the major surface is along a plane of a monocrystalline silicon layer on which transistor devices are fabricated.

For integrated circuits, the masking, patterning, and etching of device components makes possible the fabrication of semiconductor devices at the micro and nano scale. Stacked field-effect transistor (FET) devices provide many advantages for continued progress in scaling the fabrication of these devices. Despite the advantages in 3D monolithic integration and stacked FET devices, forming contact structures to 3D stacked transistors remains a challenge. Specifically, the lower source/drain (S/D) in stacked FET devices is buried underneath the top S/D and is therefore difficult to reach using existing contact formation methods.

The devices and methods disclosed below recognize problems associated with forming step nanosheet structures. Rather than fabricating the stacked FET devices as a staircase fin stack, embodiments disclosed herein include a top S/D that is epitaxially grown over a top nanosheet field-effect transistor (FET) and then etched to leave room for a bottom contact. The top FET remains at the full width, and part of the nanosheets of the top FET will not be directly attached to the top S/D. The bottom contact may be separated from the nanosheets of the top FET by a liner that surrounds the bottom contact (i.e., separated from the nanosheets only by the liner).

Figure 1:
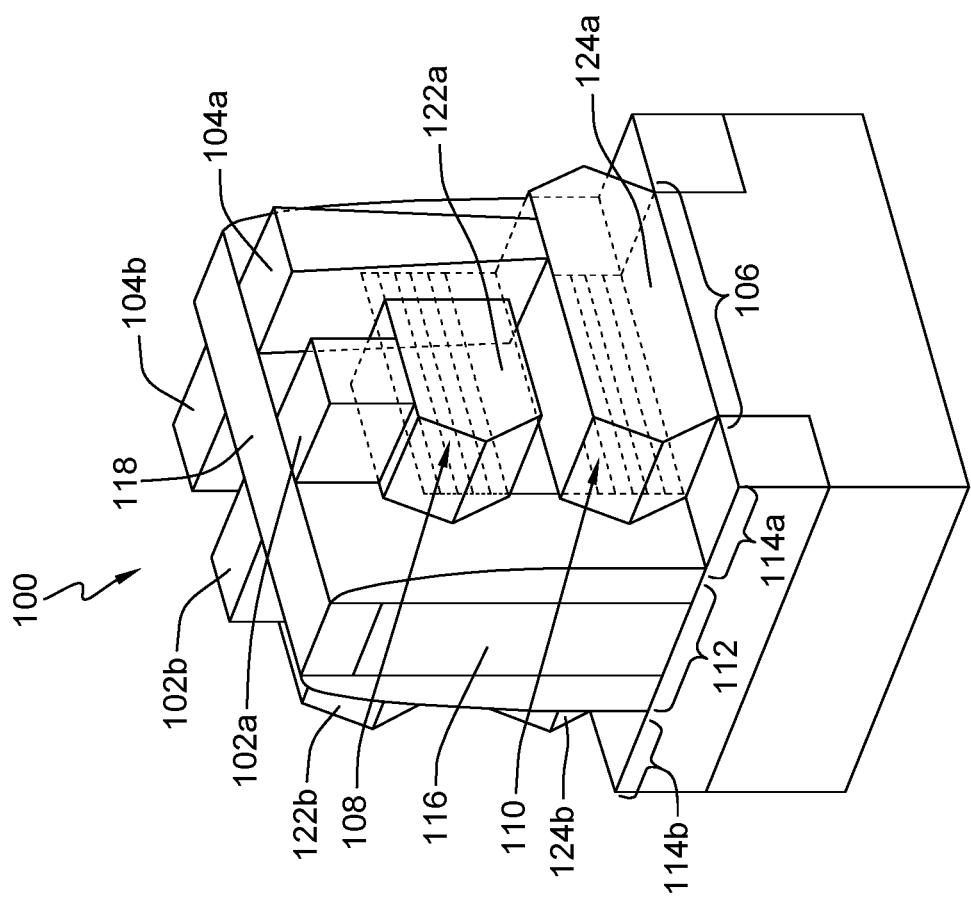
FIG. 1 depicts a schematic perspective line view of a semiconductor structure, in accordance with one embodiment of the present invention.

Turning now to the figures, FIG. 1 depicts a perspective line view of a semiconductor structure 100, in accordance with one embodiment of the present invention. The perspective line view shows a relationship of rows and columns at a fabrication stage after top source/drain (S/D) contacts 102a, b and bottom S/D contacts 104a, b have been metallized. The rows may include fins fabricated as part of a field-effect transistor (FET) region 106 (e.g., n-type FET (NFET) and p-type FET (PFET)) having a top FET 108 and a bottom FET 110.

The columns of the semiconductor structure 100 include a gate region 112 and S/D regions 114a, b. The gate region 112 runs between a first S/D region 114a on a first side of the gate region 112 and a second S/D region 114b on a second side of the gate region 112. The gate region 112 includes a high-K metal gate (HKMG) 116 that is used to control the signal flow through the FETs 108, 110, and a cap 118 to vertically insulate the HKMG 116 from additional components (not illustrated) above. The gate region 112 also includes spacers 120 that laterally insulate portions of the HKMG 116. The S/D regions 114a, b include top S/Ds 122a, b and bottom S/Ds 124a, b that electrically connect to the top S/D contacts 102a, b and the bottom S/D contacts 104a, b respectively. The bottom S/D contacts 104a, b are laterally adjacent to the top S/D contacts 102a, b, and are formed through the top S/D 122a, b such that the top S/Ds 122a, b do not cover the full width of the top FET 108. The bottom contacts 104 may include a liner that insulates from the top FET 108 and the top S/D 122a, b. This formation of the bottom S/D contacts 104a, b being formed through the top S/D contacts 102a, b enables the top FET 108 and the bottom FET 110 to be formed with a non-step nanosheet structure. A non-step nanosheet structure, as used herein, means that the top FET 108 and the bottom FET 110 have nanosheets that are the same dimensions, rather than the top FET 108 being fabricated with a smaller width that is only as wide as would be necessary for the top S/D 122a, b.

The embodiments disclosed herein recognize that having nanosheets extend beyond the area of the S/D (as shown in the top FET 108 and top S/Ds 122a, b of FIG. 1) is not typical. Such a FET, however, is recognized by the embodiments herein to not sustain major defect in either functionality or longevity. The lack of step nanosheet structure also enables a more uniform masking of the FET region 106 before formation of the bottom S/Ds 124a, b. On the other hand, the bottom contacts 104a, b through the portion of the first top S/Ds 122a, b enables the top FET 108 and the bottom FET 110 to be fabricated concurrently without additional masking or etching steps.

FIG. 2 depicts a schematic cross-sectional top view of the semiconductor structure of FIG. 1 at a fabrication stage, in accordance with one embodiment of the present invention. The view of the semiconductor structure 100 shows a pair of gate regions 112, the top S/D contacts 102, and the bottom S/D contacts 104. The semiconductor structure 100 is typically fabricated in pairs of gate regions 112, as illustrated, due to the type of semiconductor that is formed in the substrate (i.e., both gate regions 112 are formed over NFET regions or both over PFET regions). The following figures are cross-sectional side views of: (i) the bottom S/D contact along line A-A'; (ii) the gate region 112 along line B-B'; and (iii) the S/D region 114a along line C-C' at fabrication stages of the semiconductor structure 100.

Figure 3B:
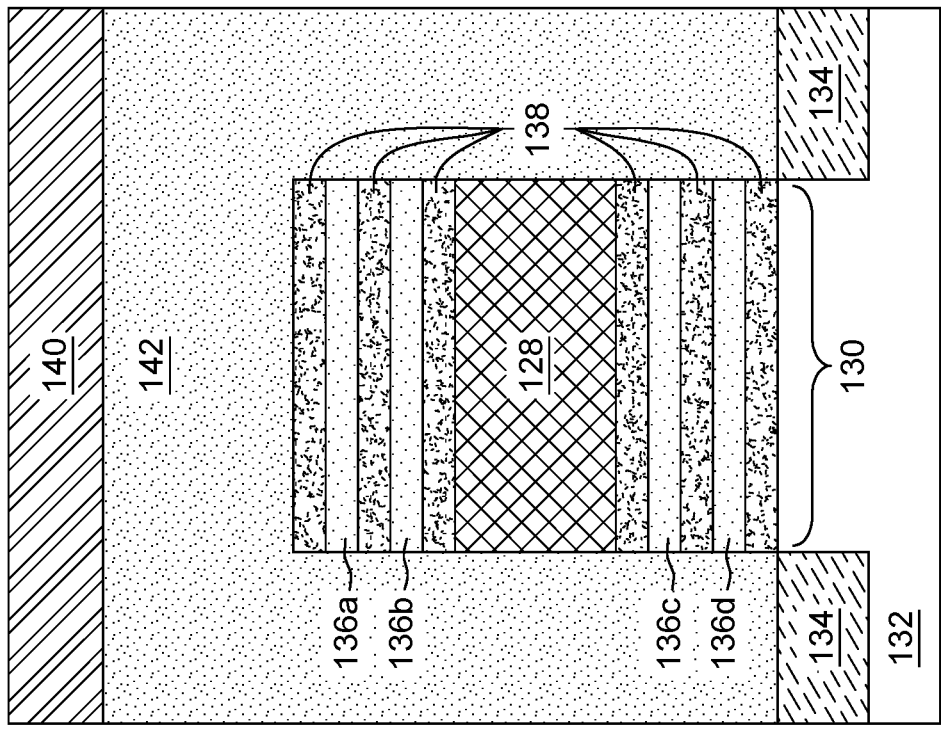
FIGS. 3A, 3B, and 3C depict schematic cross-sectional side views of the semiconductor structure of FIG. 1 at a subsequent fabrication stage, in accordance with one embodiment of the present invention.
Figure 3A:
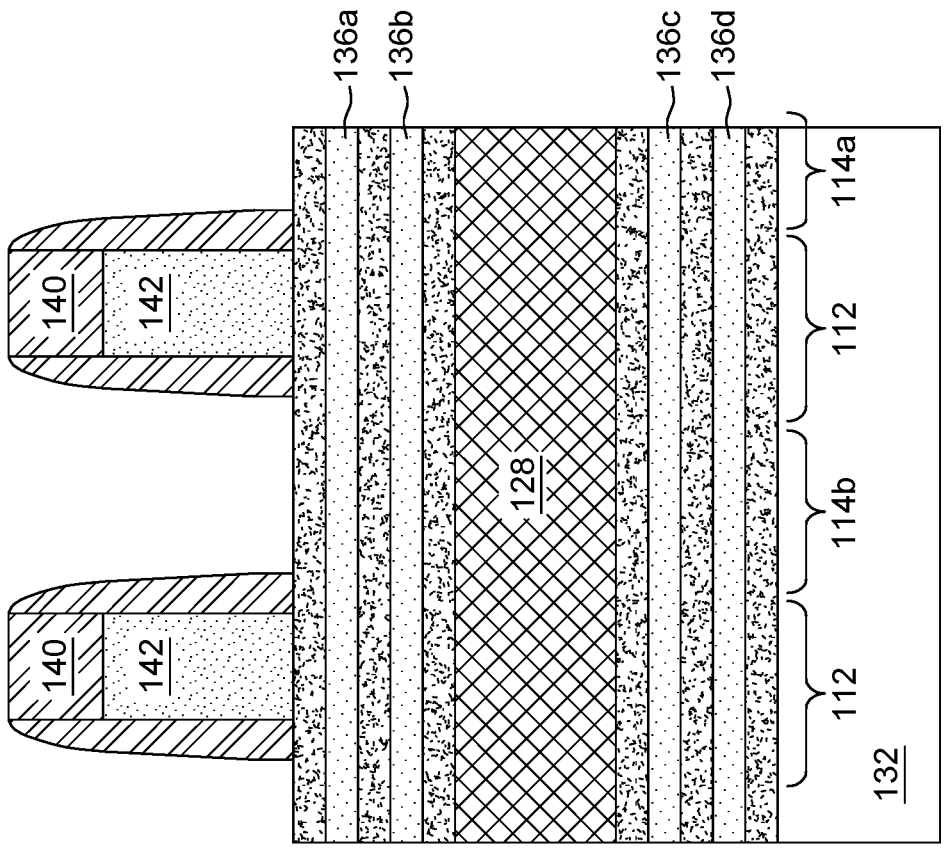
Figure 3C:
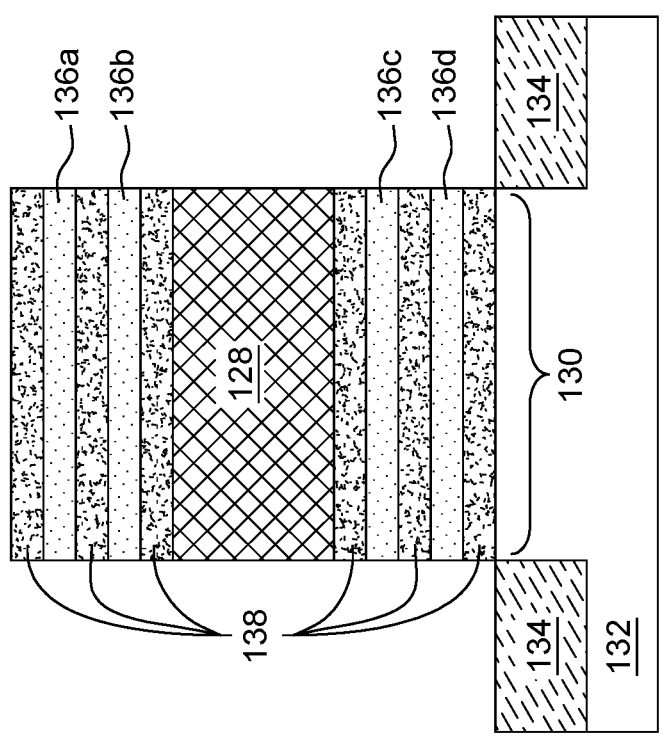

FIGS. 3A, 3B, and 3C are schematic cross-sectional side views of the semiconductor structure 100 of FIG. 1 at a fabrication stage in the locations indicated in the description of FIG. 2, in accordance with one embodiment of the present invention. The semiconductor structure 100 has a fin 130 that extends laterally through the gate regions 112 and the S/D regions 114a, b. A substrate 132 and shallow trench isolation (STI) 134 also extend along the length of the semiconductor structure 100 through the gate region 112 and the S/D regions 114a, b.

The fin 130 includes layers for the bottom FET 110 and the top FET 108 separated by an isolation layer 128. That is, above the silicon substrate 132, the semiconductor structure 100 includes nanosheet layers 136a, b, c, d that form the transistors. The nanosheet layers 136a, b, c, d may be fabricated, for example, by forming epitaxial semiconductor layers sequentially above the bottom-most semiconductor layer above the silicon substrate 132. Initially, a layer of silicon and a layer of BOX $SiO_2$ may be fabricated above the silicon substrate 132. Then the layers may be converted into alternating SiGe layers 138 and Si layers by growing a SiGe layer through a condensation process to convert the bottom most semiconductor layer above the silicon substrate 132 to SiGe. After that, the oxide above the SiGe is removed, followed by alternative layers of Si and SiGe layer growth. Other methods may be used to form the nanosheet layers 136a, b, c, d and the SiGe layers 138. Certain embodiments may also include other forms of transistors.

The bottom FET 110 and the top FET 108 may be patterned by conventional lithography and etch processes such as reactive ion etching (RIE). Specifically, the nanosheet layers 136a, b, c, d and SiGe layers 138 are covered by a hard mask 140 and a dummy gate 142. The hard mask 140 includes a material such as SiN, SiO2 or combination of both layers. The dummy gate 142 may include materials such as SiO2, amorphous silicon, or polycrystalline silicon (poly silicon). The hard mask 140 may then block etching while the nanosheet layers 136a, b, c, d and SiGe layers 138 are etched from the S/D regions 114a, b.

Figure 4B:
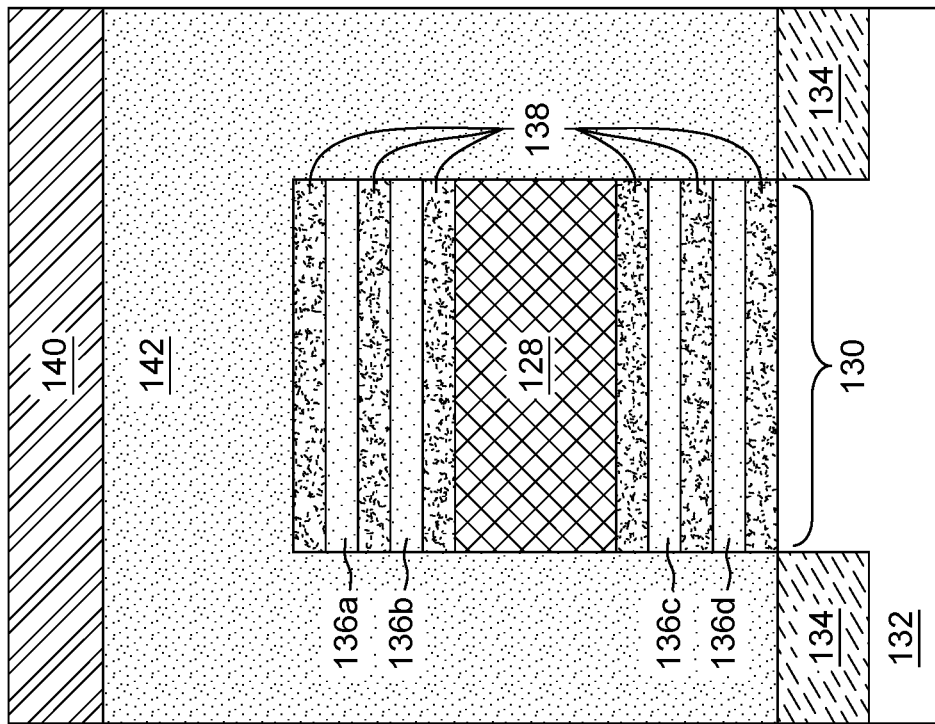
Figure 4A:
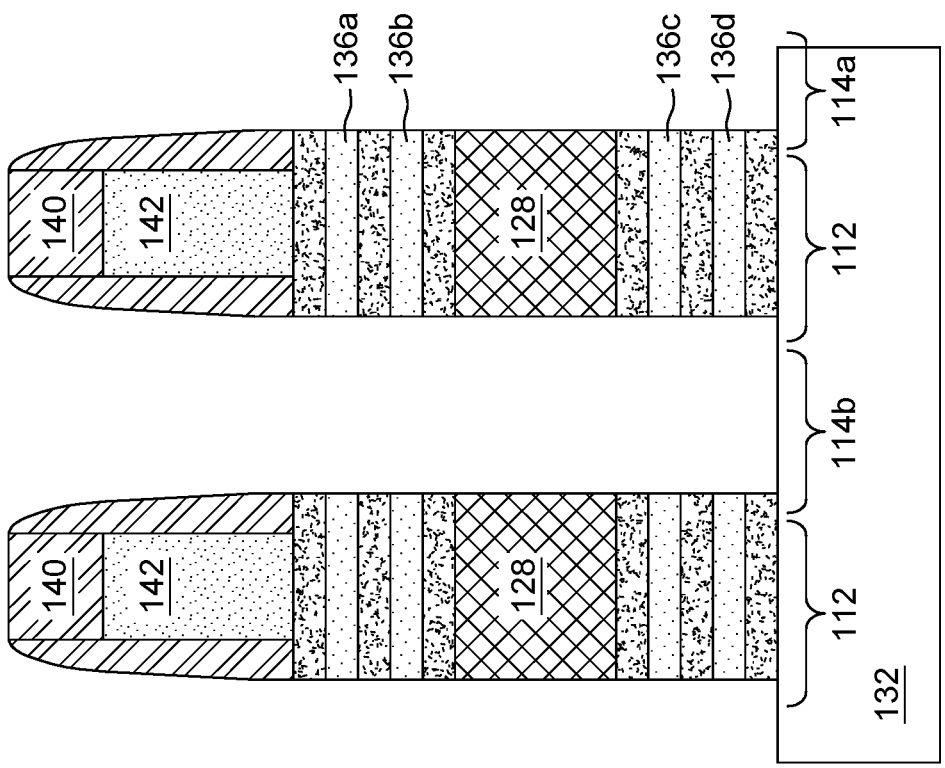

FIGS. 4A, 4B, and 4C are schematic cross-sectional side views of the semiconductor structure of FIG. 1 at a subsequent fabrication stage, in accordance with one embodiment of the present invention. The hard mask 140 has blocked the etching so the nanosheet layers 136a, b, c, d and SiGe layers 138 are etched from the S/D regions 114, but not the gate regions 112. The nanosheet layers 136a, b, c, d and SiGe layers 138 are thus exposed on the lateral sides facing the S/D regions 114a, b, and the dummy gate 142 only remains in the gate region 112. The cross-section of the S/D region 114a illustrated in FIG. 4C thus shows no material directly above the substrate 132 and the STI 134; the outline of the nanosheets 136a, b, c, d are shown for illustrative purposes, as the nanosheets 136a, b, c, d are exposed but not present in the S/D region 114a.

Figure 5B:
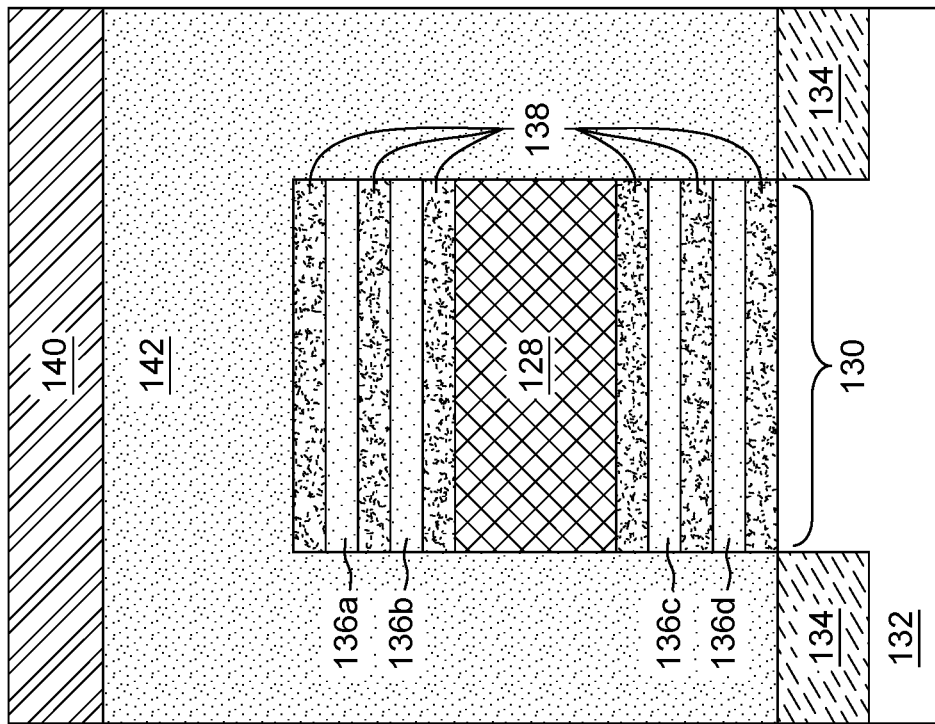
FIGS. 5A, 5B, and 5C depict schematic cross-sectional side views of the semiconductor structure of FIG. 1 at a subsequent fabrication stage, in accordance with one embodiment of the present invention.
Figure 5A:
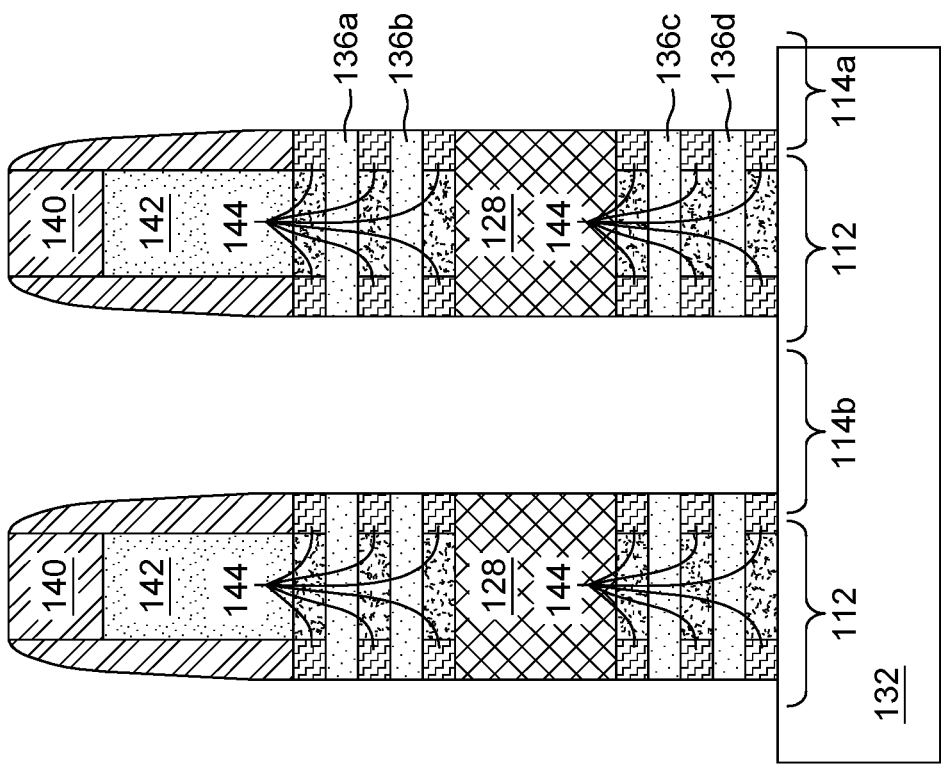
Figure 5C:
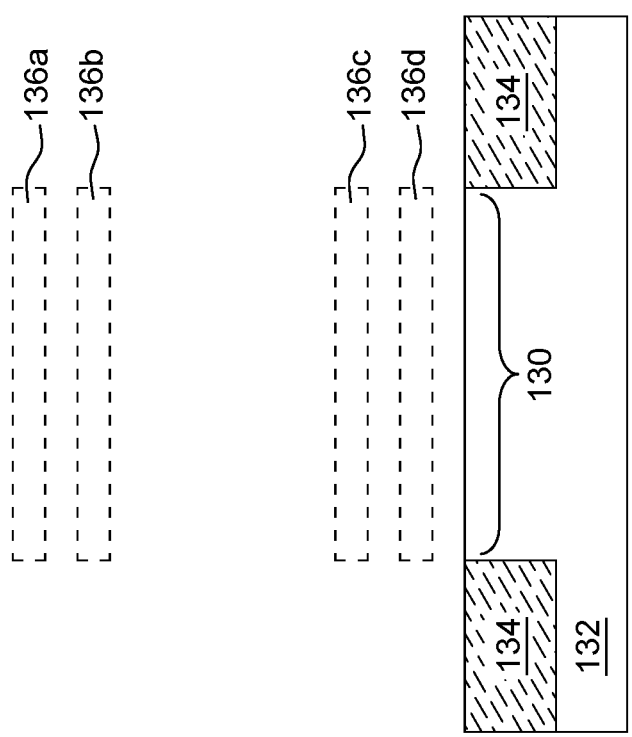

FIGS. 5A, 5B, and 5C are schematic cross-sectional side views of the semiconductor structure of FIG. 1 at a subsequent fabrication stage, in accordance with one embodiment of the present invention. The semiconductor structure 100 may have the SiGe layers 138 recessed from the direction of the S/D regions 114a, b, with the recessions replaced by support spacers 144. The recession is completed using a selective etch process that does not affect the hard mask 140, the isolation layer 128, or the nanosheets 136a, b, c, d that remain in the gate region 112. After the recession process, the support spacers 144 seal the edges of the SiGe layers 138, and fill in the empty area between the nanosheet layers 136a, b, c, d of the top FET 108 and the bottom FET 110. The support spacers 144 typically do not protrude into the S/D regions 114, and therefore the support spacers 144 and the nanosheet layers 136a, b, c, d are flush with each other and with the hard mask 140 and the isolation layer 128. The support spacers 144 may include nitride based material such as silicon boron carbide nitride (SiBCN), SiOCN, SiN, SiOC, etc. or other non-nitride based masking materials.

Figure 6B:
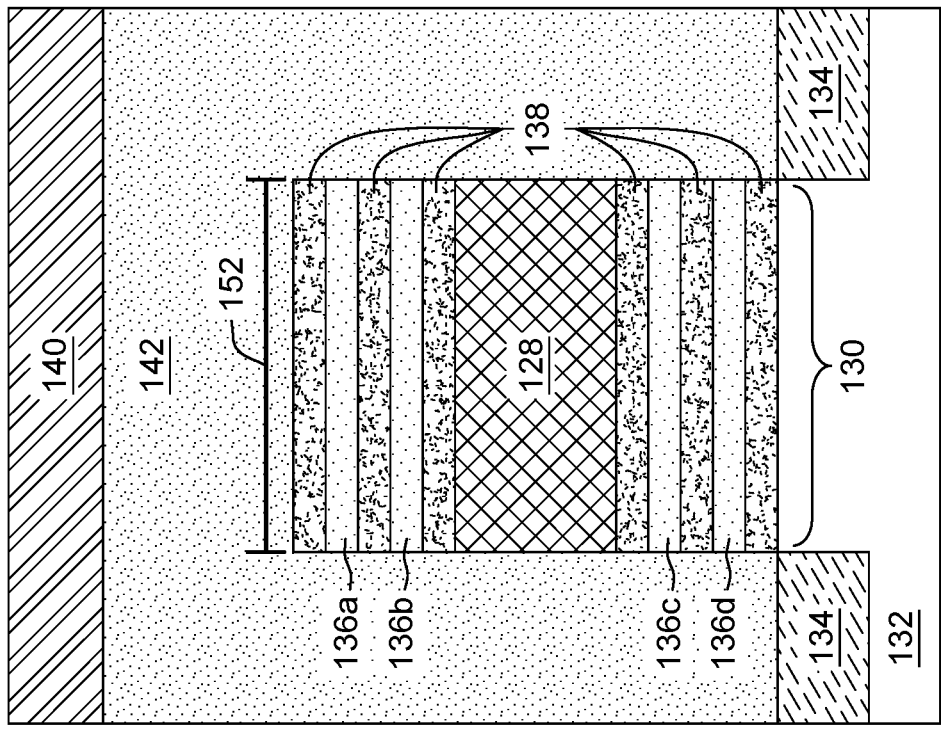
FIGS. 6A, 6B, and 6C depict schematic cross-sectional side views of the semiconductor structure of FIG. 1 at a subsequent fabrication stage, in accordance with one embodiment of the present invention.
Figure 6A:
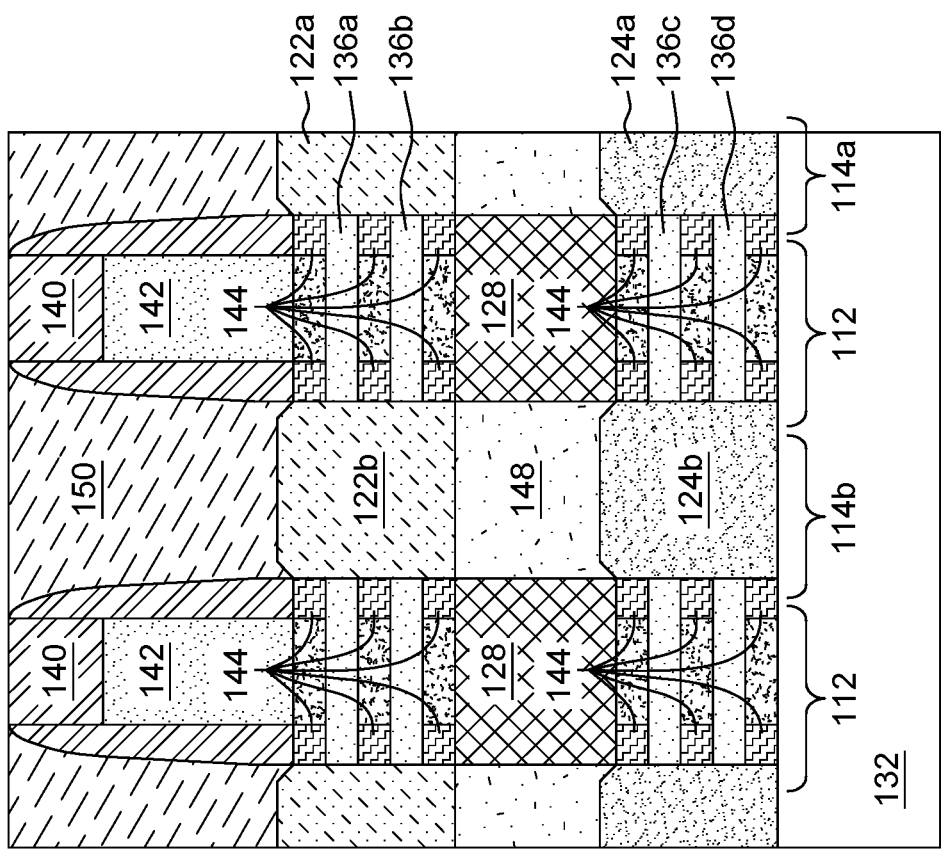
Figure 6C:
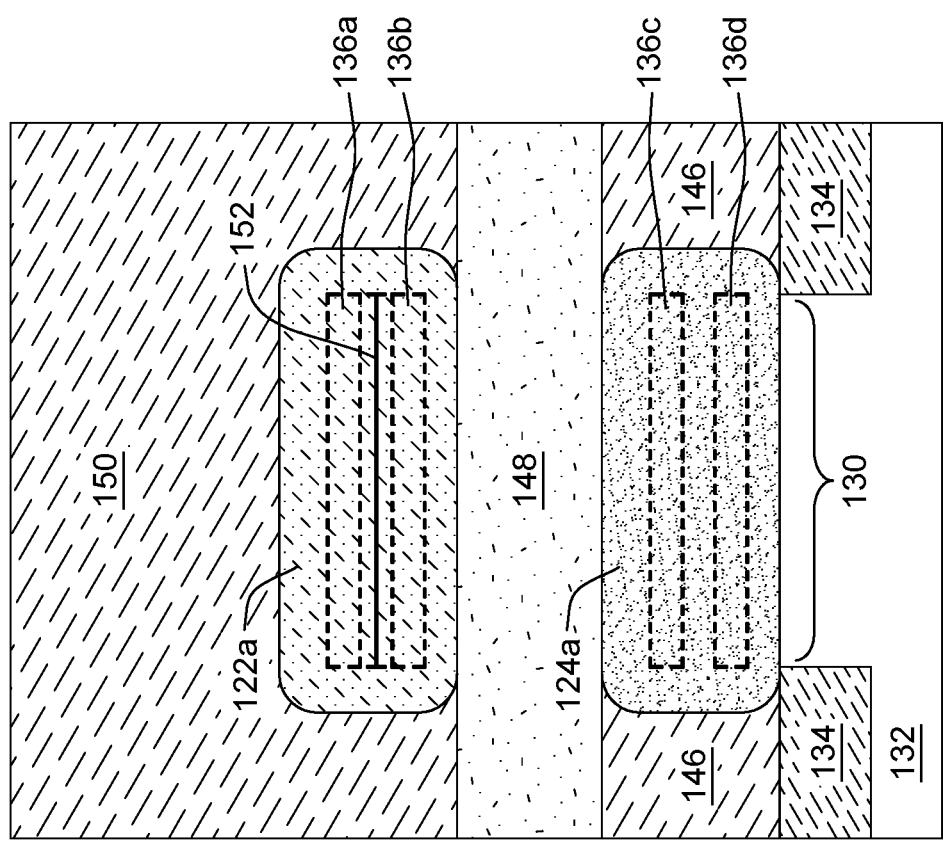

FIGS. 6A, 6B, and 6C are schematic cross-sectional side views of the semiconductor structure 100 of FIG. 1 at a subsequent fabrication stage, in accordance with one embodiment of the present invention. The semiconductor structure 100 has the bottom S/Ds 124a, b, a bottom dielectric layer 146, a S/D isolation layer 148, the top S/Ds 122a,

*b*, and a top dielectric layer 150 formed in the S/D regions 114*a, b*. The bottom S/Ds 124*a, b* are formed first in the S/D regions 114, and may be formed by epitaxial growth from the substrate 132 and the bottom nanosheet layers 136*c, d*. The bottom S/Ds 124*a, b* do not grow on the STI 134. The bottom dielectric layer 146 is then formed between the bottom S/Ds 124*a, b* (shown in FIG. 6C), with the S/D isolation layer 148 being deposited over both the bottom S/Ds 124*a, b* and the bottom dielectric layer 146. The bottom dielectric layer 146 may include SiN, SiOx, SiCN, SiCN(H), a low-k dielectric material, or an ultra-low-k dielectric material. The top S/Ds 122*a, b* are epitaxially grown similarly to the bottom S/Ds 124*a, b*: grown on the nanosheet layers 136*a, b* without growing on the hard mask 140. The top dielectric layer 150 may then be deposited around the top S/Ds 122*a, b*.

In contrast to some stacked nanosheet FET devices, the bottom S/Ds 124*a, b* and the top S/Ds 122*a, b* are both grown fully across the bottom nanosheets 136*c, d* and top nanosheets 136*a, b*, which have a width 152 that is the same due to the consistent formation of the fin 130 between the top FET 108 and the bottom FET 110, respectively. That is, the top FET 108 (and the formation of the top S/Ds 122*a, b*) does not require any special or different masking than is used for the bottom FET 110 (and the bottom S/Ds 124*a, b*). The single masking step (i.e., forming the hard mask 140) streamlines the fabrication process, and eliminates steps that take up time and resources. Avoiding separate masking for the top FET 108 also reduces the chance for defects that can result from imperfect micro masking for the bottom FET 110.

Figure 7B:
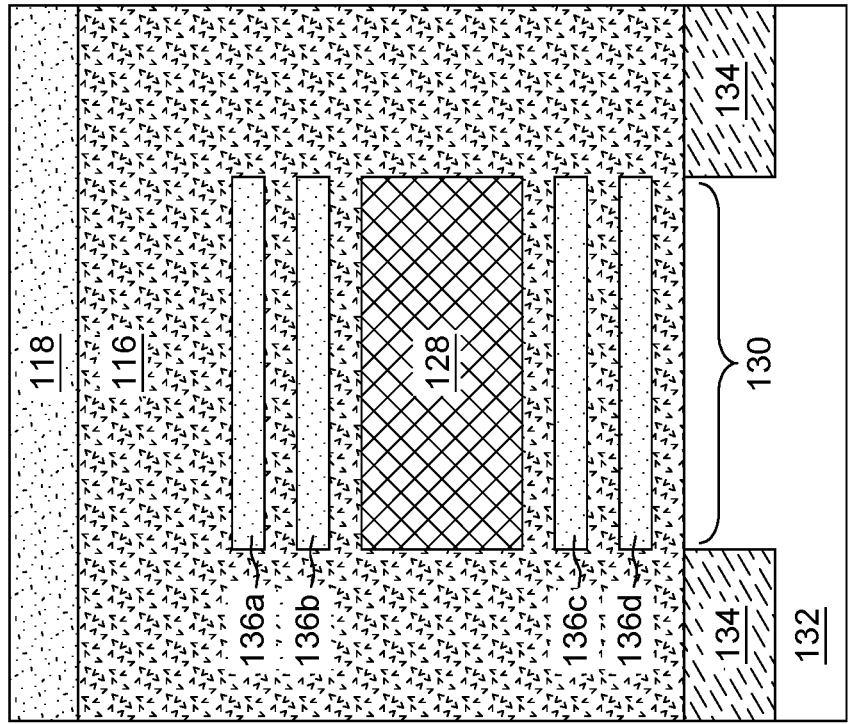
FIGS. 7A, 7B, and 7C depict schematic cross-sectional side views of the semiconductor structure of FIG. 1 at a subsequent fabrication stage, in accordance with one embodiment of the present invention.
Figure 7A:
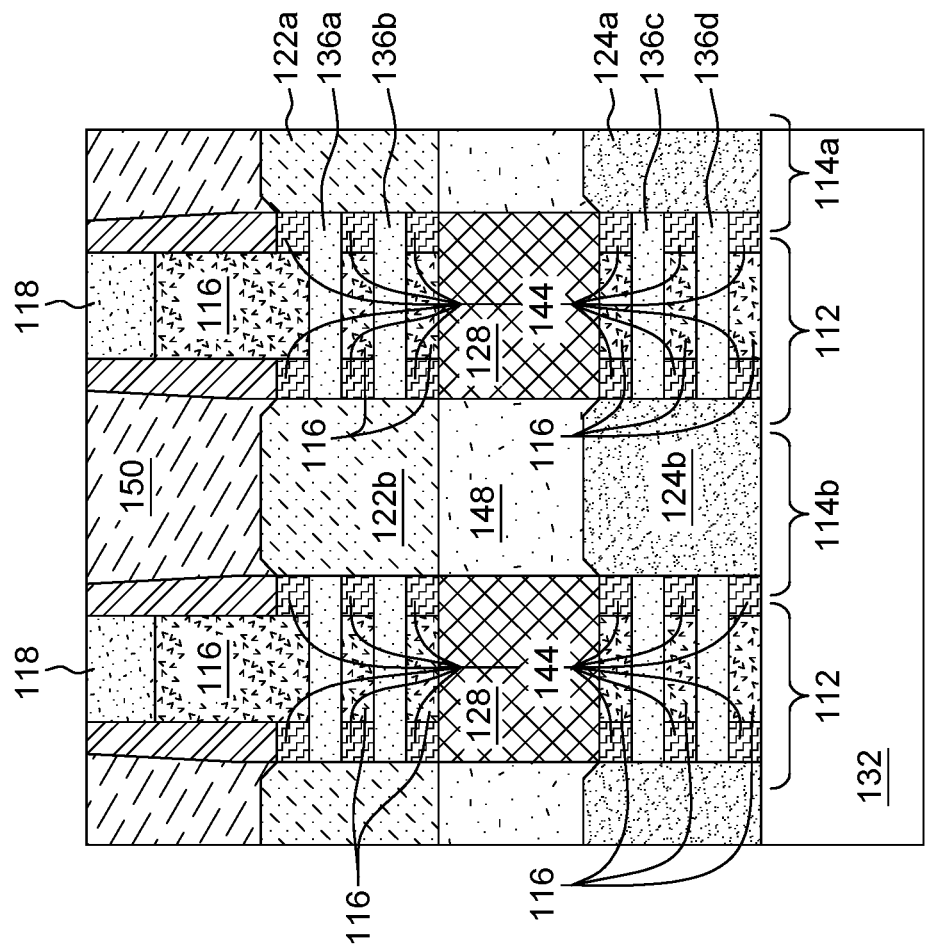
Figure 7C:
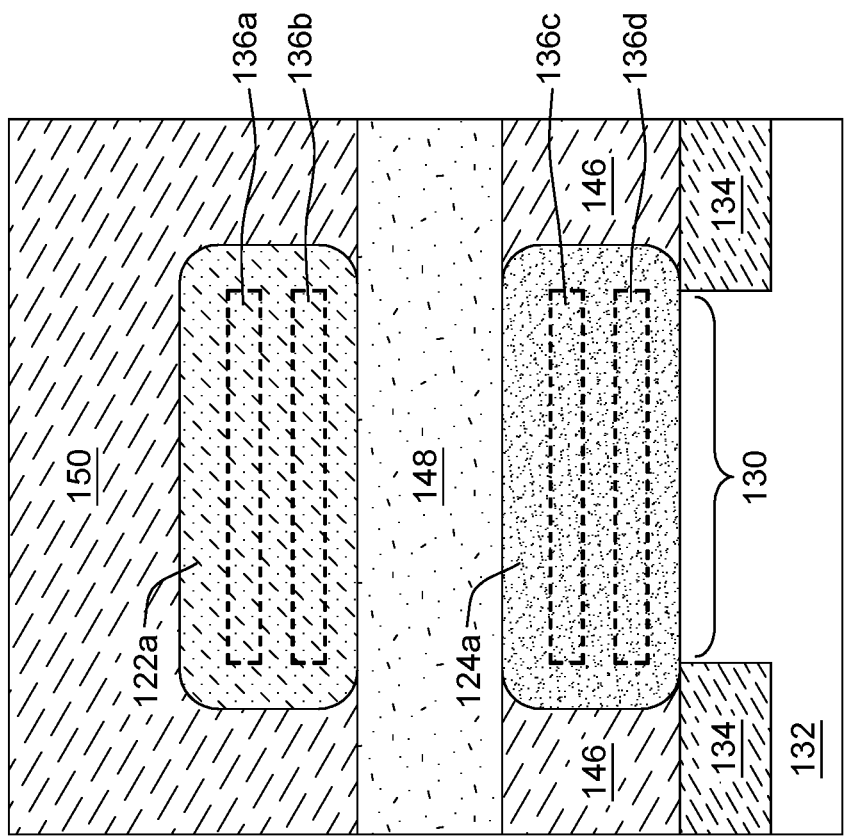

FIGS. 7A, 7B, and 7C are schematic cross-sectional side views of the semiconductor structure of FIG. 1 at a subsequent fabrication stage, in accordance with one embodiment of the present invention. The semiconductor structure 100 includes the HKMG 116 and the cap 118, which have replaced the SiGe layers 138, the dummy gate 142, and a portion of the hard mask 140.

The SiGe layers 138 and the dummy gate 142 may be removed using a selective etch process that etches the SiGe layers 138 and the dummy gate 142 without affecting the nanosheet layers 136*a, b, c, d*, the support spacers 144, or the S/Ds 122, 124. The hard mask 140 may be removed by grinding or etching down the height of the semiconductor structure 100. The support spacers 144 support the nanosheets 136*a, b, c, d* after the dummy gate 142 is removed, since there is otherwise only empty space between the nanosheets 136*a, b, c, d*. The HKMG 116 may then be formed in all the empty space from which the SiGe layers 138 and the dummy gate 142 were removed. The result is that the HKMG 116 surrounds the nanosheet layers 136*a, b, c, d* to control the signals passing therethrough from one S/D on one side of the HKMG 116 to another S/D on the other side of the HKMG 116.

Figures 8A, 8B:
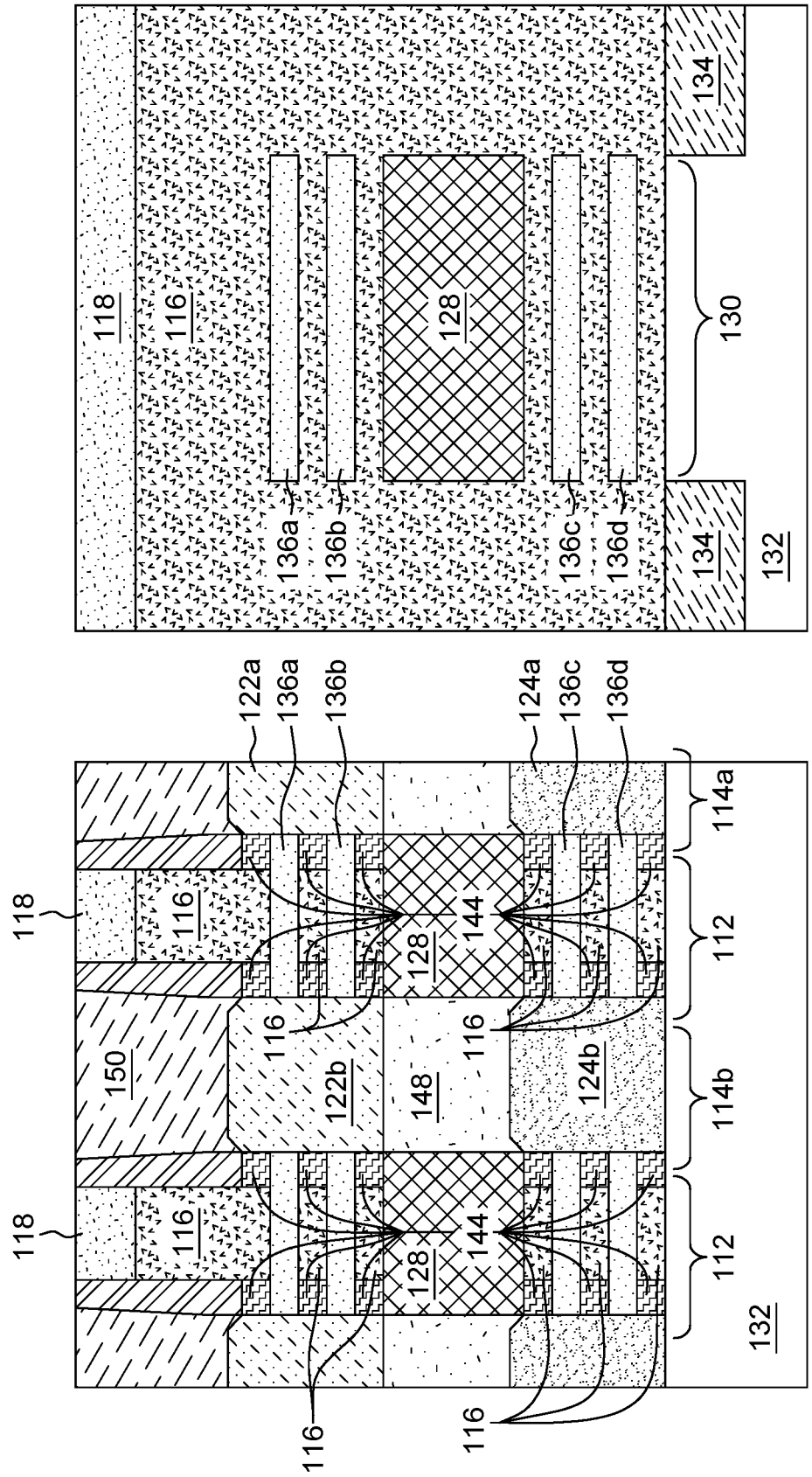
FIGS. 8A, 8B, and 8C depict schematic cross-sectional side views of the semiconductor structure of FIG. 1 at a subsequent fabrication stage, in accordance with one embodiment of the present invention.
Figure 8C:
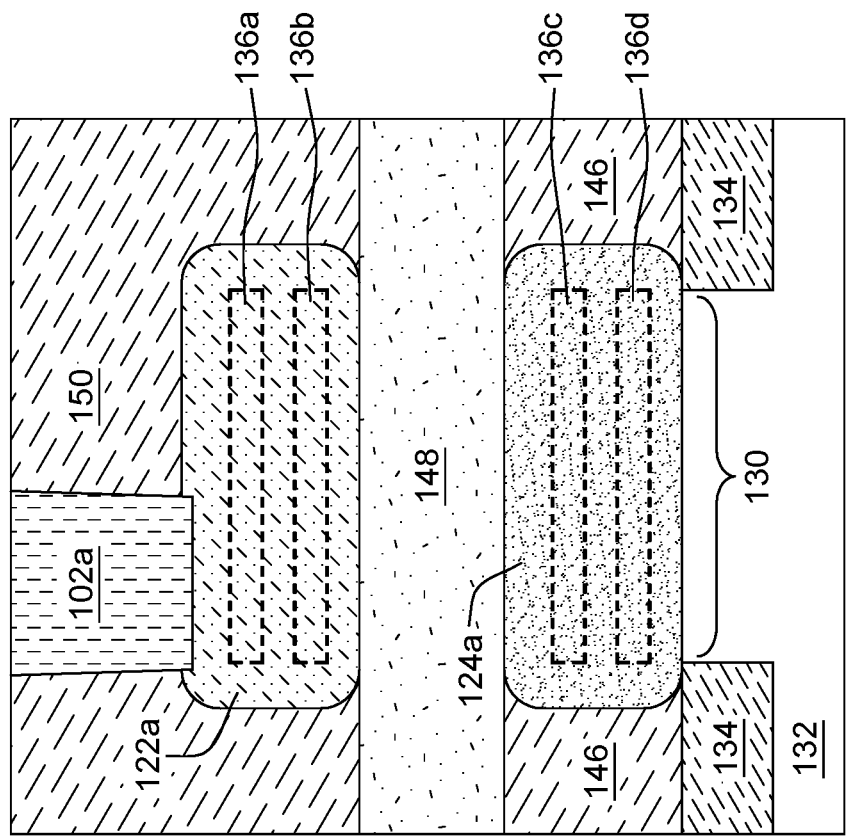

FIGS. 8A, 8B, and 8C are schematic cross-sectional side views of the semiconductor structure 100 of FIG. 1 at a subsequent fabrication stage, in accordance with one embodiment of the present invention. The semiconductor structure 100 includes the top S/D contact 102*a* connected to the top S/D 122*a*. The top S/D contact 102*a* does not appear in the area for the bottom S/D contact shown in FIG. 8A, or in the gate region 112 shown in FIG. 8B. The top S/D contact 102*a* is formed through the top dielectric layer 150, and may include the use of a hard mask (not shown) that is lithographically patterned and then etched to remove a hole in the top dielectric layer 150 that protrudes down to the top S/D 122*a*. The top S/D contact 102*a* may be formed by metalizing this hole. The top S/D contact 102*a* may be formed out of other conductive materials as well.

Figure 9B:
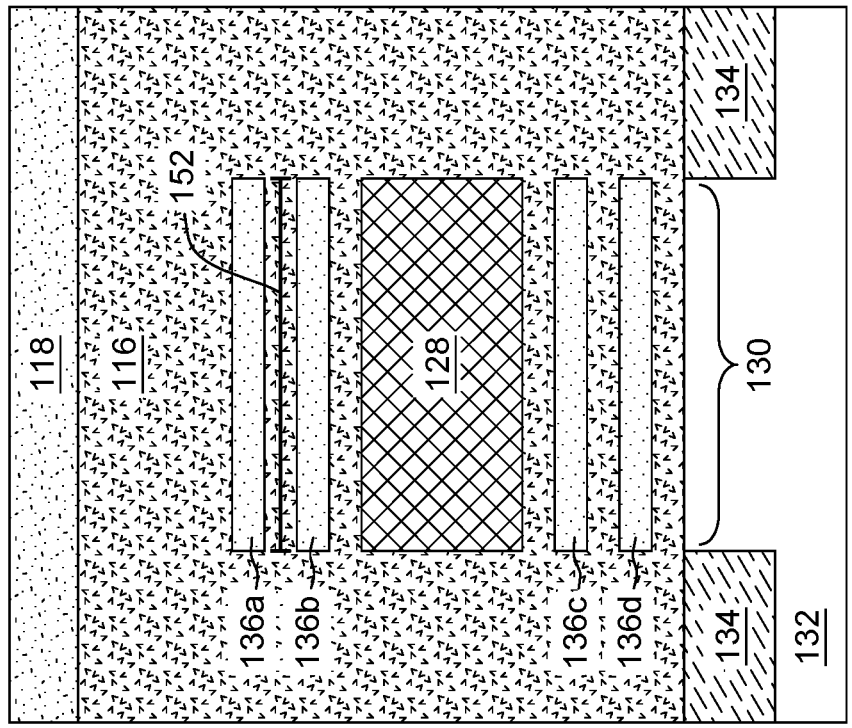
FIGS. 9A, 9B, and 9C depict schematic cross-sectional side views of the semiconductor structure of FIG. 1 at a subsequent fabrication stage, in accordance with one embodiment of the present invention.
Figure 9A:
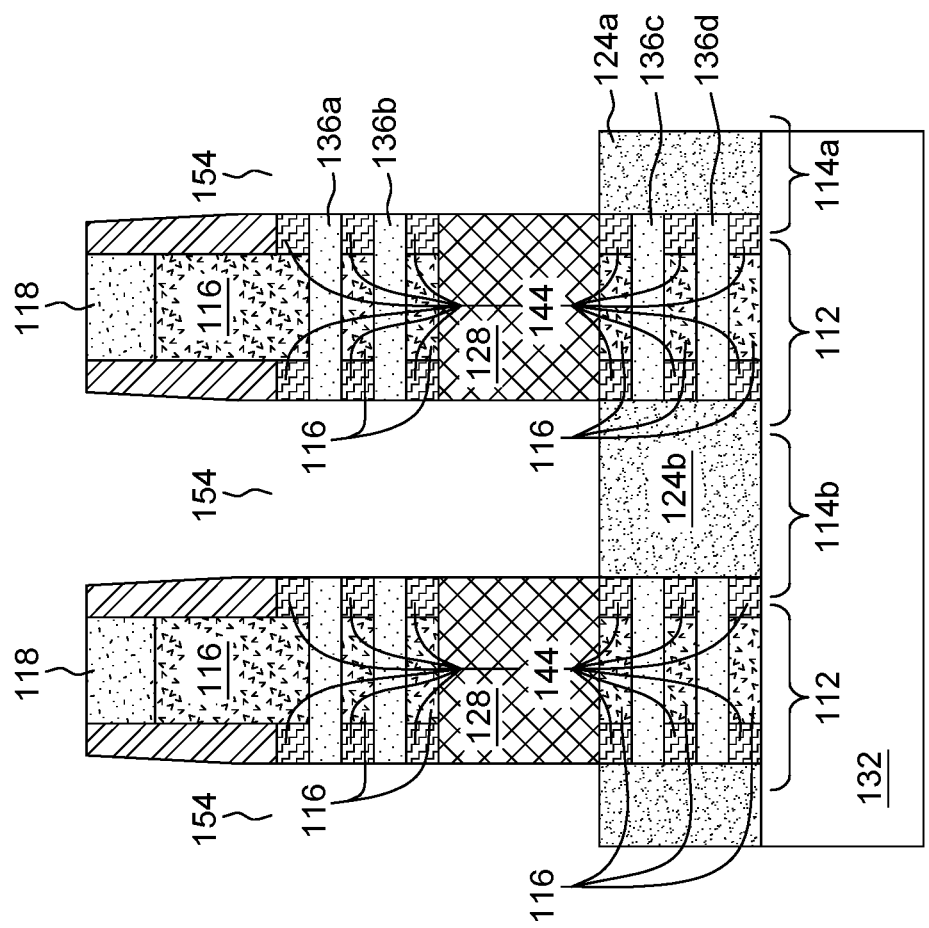
Figure 9C:
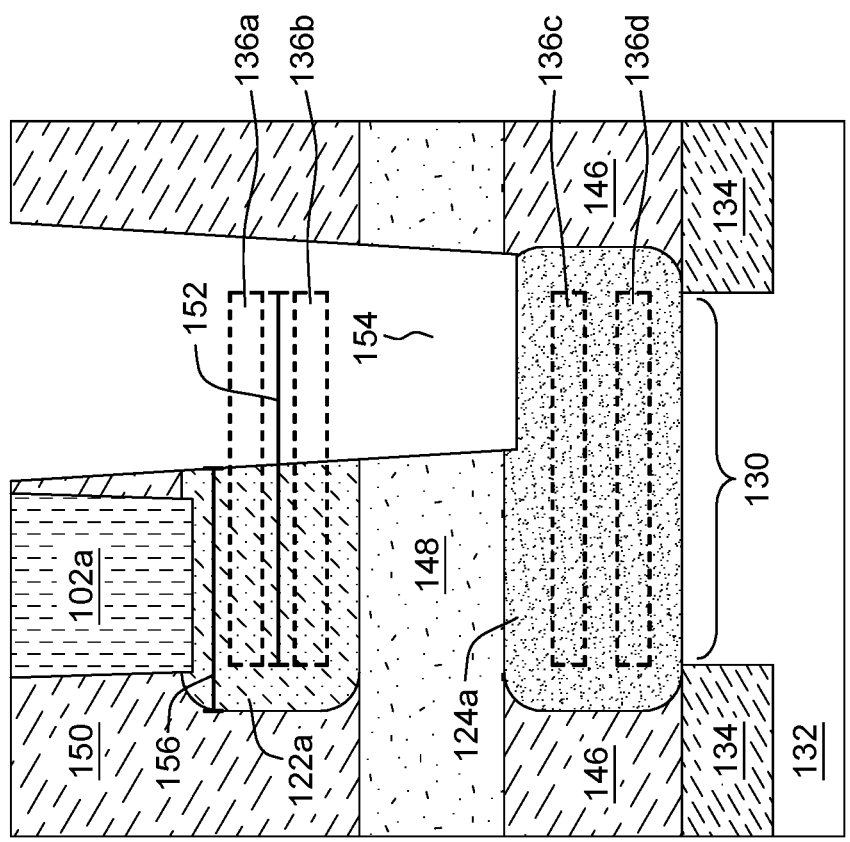

FIGS. 9A, 9B, and 9C are schematic cross-sectional side views of the semiconductor structure 100 of FIG. 1 at a subsequent fabrication stage, in accordance with one embodiment of the present invention. The semiconductor structure 100 includes bottom contact holes 154 etched for the formation of the bottom S/D contacts 104. The bottom contact holes 154 may be formed similarly to the hole for the top S/D contact 102*a*: using a hard mask that is lithographically etched. The bottom contact holes 154 are only etched in the S/D regions 114, so none of the HKMG 116, nanosheets 136*a, b, c, d*, support spacers 144, or isolation layer 128 are affected. The etch may be completed using a directional etch process such as reactive ion etch (RIE) but may also be completed using a selective etch process.

The bottom contact holes 154 are formed by removing a portion of the top S/Ds 122*a, b* without removing the accompanying nanosheets 136*a, b*. That is, the top S/Ds 122*a, b* have a reduced width 156 after the bottom contact holes 154 are etched, while the bottom and top nanosheets 136*a, b, c, d* all remain with the full nanosheet width 152. In other words, the bottom FET 110 has a length and width 152 that is equal to a length and width 152 of the top FET 108, and the top nanosheet 136*a, b* is wider than the top S/D 122*a*.

Figure 10B:
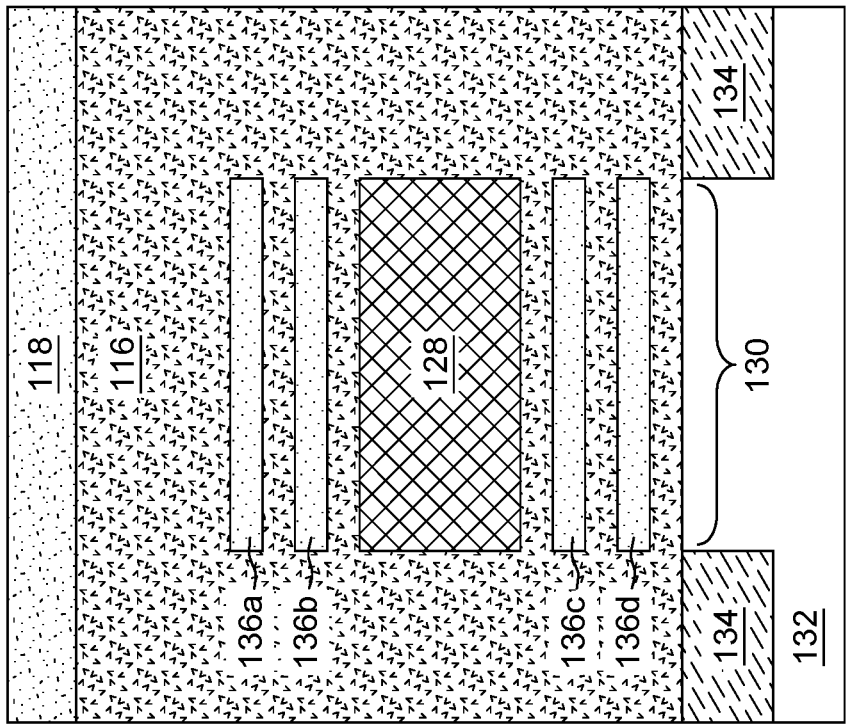
FIGS. 10A, 10B, and 10C depict schematic cross-sectional side views of the semiconductor structure of FIG. 1 at a subsequent fabrication stage, in accordance with one embodiment of the present invention.
Figure 10A:
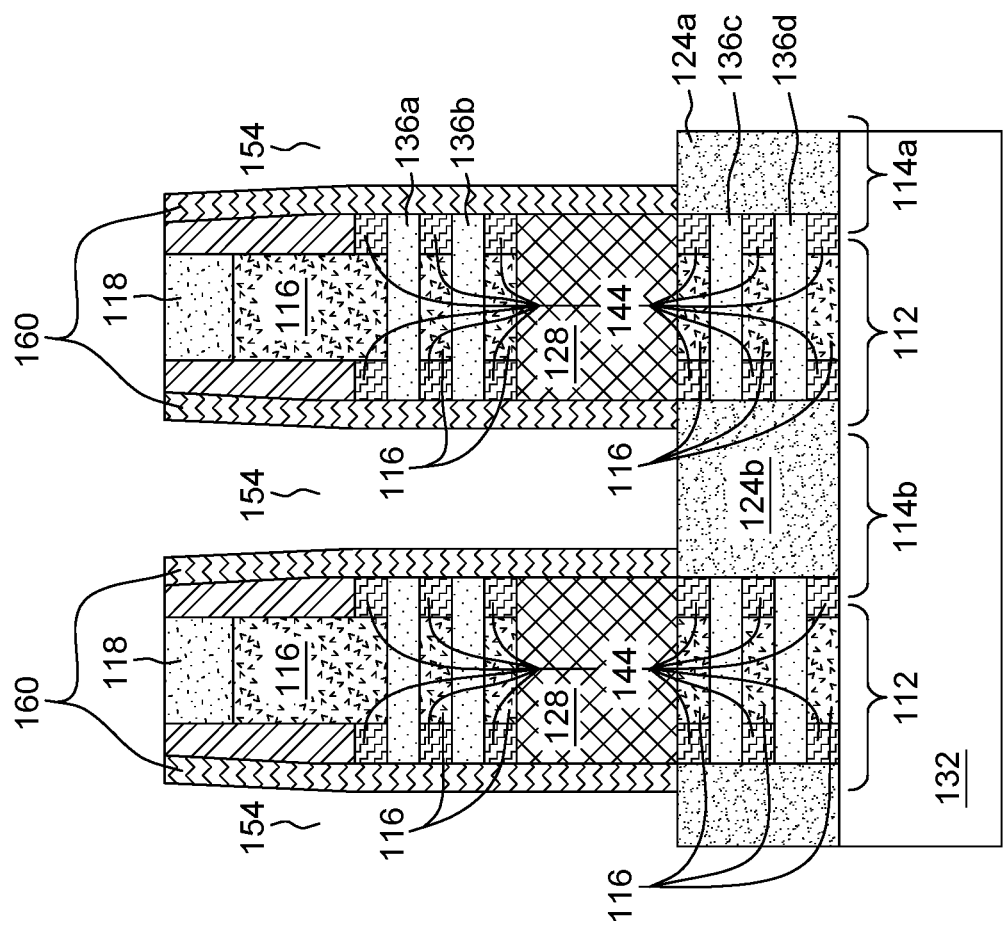
Figure 10C:
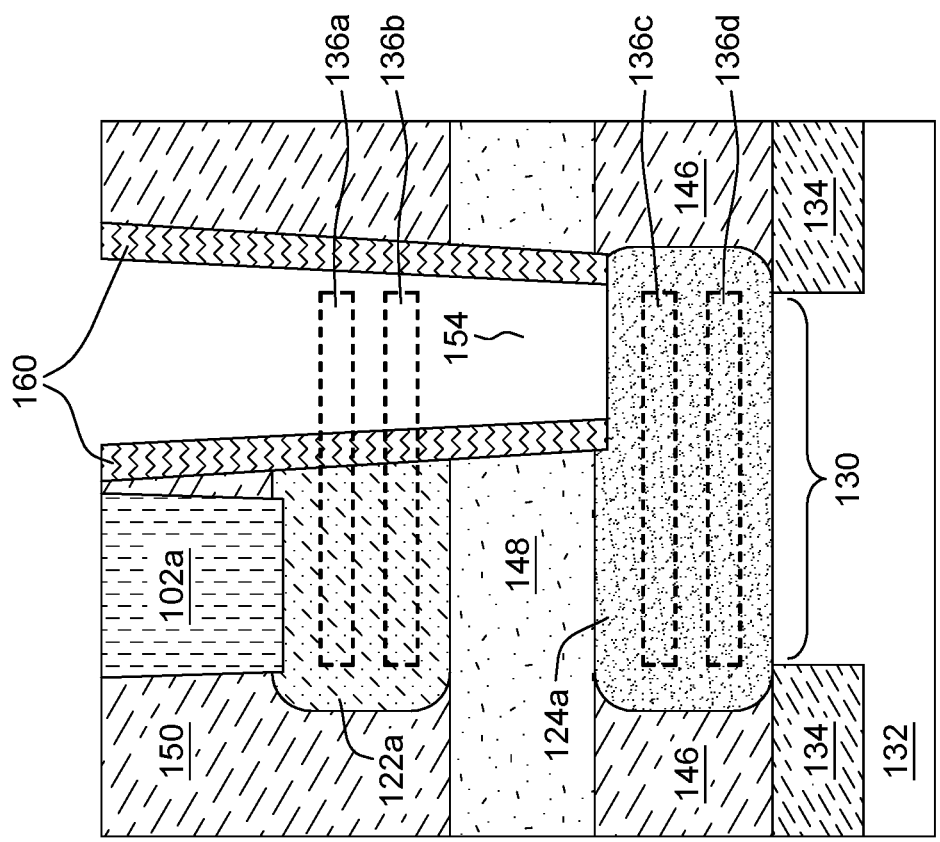

FIGS. 10A, 10B, and 10C are schematic cross-sectional side views of the semiconductor structure 100 of FIG. 1 at a subsequent fabrication stage, in accordance with one embodiment of the present invention. The semiconductor structure 100 includes a liner 160 lining the bottom contact holes. The liner 160 may be formed using a deposition process within the bottom contact holes 154 that deposits a dielectric material as a blanket layer on all the top surfaces of the semiconductor structure 100. The liner 160 may then be submitted to a directional etch process directly from above the semiconductor structure 100 that etches the liner 160 on the horizontal surfaces faster, such that the liner 160 only remains on the more vertical sides of the bottom contact holes 154.

Figure 11C:
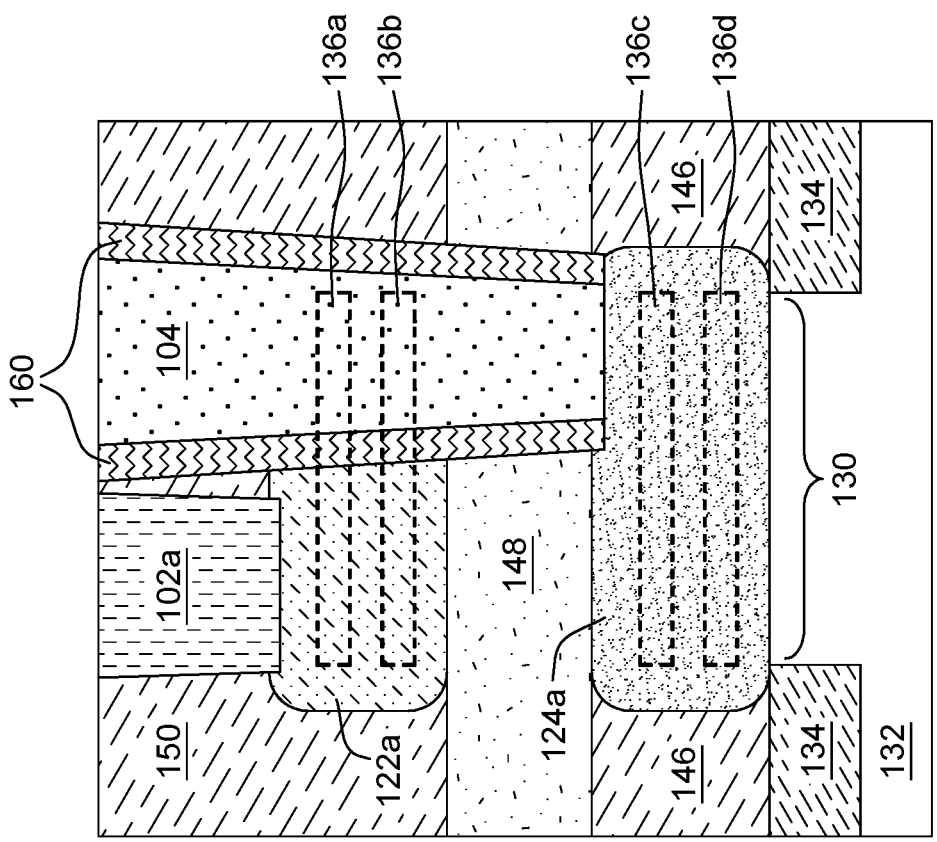

FIGS. 11A, 11B, and 11C are schematic cross-sectional side views of the semiconductor structure 100 of FIG. 1 at a subsequent fabrication stage, in accordance with one embodiment of the present invention. The semiconductor structure 100 includes the metalized bottom S/D contacts 104 that connect the bottom S/Ds 124*a, b* to the upper components, at the same fabrication stage that is shown in FIG. 1. The bottom S/D contacts 104 do not electrically connect to the top S/D 122*a* or the top nanosheets 136*a, b*, which may be prevented specifically by the liner 160, but certain embodiments may include no liner 160 or a different structure to insulate the bottom S/D contacts 104 from the top S/D 122*a* and the top nanosheets 136*a, b*. The semiconductor structure 100 thus includes a first FET 108 stacked above a second FET 110 in a non-step nanosheet structure. Furthermore, the bottom contact 104 is electrically connected to the first bottom S/D 124*a* of the second FET 110 through a portion of the top S/D 122*a* of the first FET 108. The first FET 108 may include a nanosheet layer 136*a* at least partially unconnected to the first top S/D 122*a* due to the etching of the top S/D 122*a* after the epitaxial growth of the top S/D 122*a*.

The integrated circuit chips resulting from the processes described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application is not limited to the exact forms and details described and illustrated, but fall within the scope of the appended claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
    a first field-effect transistor (FET) stacked above a second FET in a non-step nanosheet structure, wherein the first FET comprises a nanosheet layer at least partially unconnected to the first top S/D; and
    a bottom contact electrically connected to a first bottom source/drain (S/D) of the second FET through a portion of a first top S/D of the first FET.

2. The semiconductor structure of claim 1, further comprising a liner surrounding the bottom contact.

3. The semiconductor structure of claim 2, wherein the liner is located directly between the bottom contact and the first FET.

4. The semiconductor structure of claim 1, further comprising a top contact laterally adjacent to the bottom contact.

5. The semiconductor structure of claim 1, wherein the second FET comprises a nanosheet layer completely connected to the first bottom S/D.

6. The semiconductor structure of claim 1, wherein the first FET comprises a top nanosheet layer comprising a first length and width, and the second FET comprises a bottom nanosheet layer comprising a second length and width equal to the first length and width.

7. A semiconductor structure, comprising:
    a top field-effect transistor (FET), comprising:
        a top nanosheet; and
        a top source/drain (S/D), wherein the top nanosheet is wider than the top S/D;
    a bottom FET, comprising:
        a bottom nanosheet; and
        a bottom S/D, wherein the bottom nanosheet has a same width as the top nanosheet, and the bottom S/D is wider than the top S/D; and
    a bottom contact electrically connected to the bottom S/D through a portion of a first top S/D of the first FET.

8. The semiconductor structure of claim 7, further comprising a top contact laterally adjacent to the bottom contact.

9. The semiconductor structure of claim 7, further comprising a liner surrounding the bottom contact.

10. The semiconductor structure of claim 9, wherein the liner is located between the bottom contact and the top nanosheet.

11. The semiconductor structure of claim 9, wherein the liner is located between the bottom contact and the top contact.

12. The semiconductor structure of claim 9, wherein the liner is located between the bottom contact and the top S/D.

13. The semiconductor structure of claim 7, further comprising an isolation layer between the top FET and the bottom FET.

* * * * *